United States Patent [19]

Weinberg et al.

[11] Patent Number: 4,669,179
[45] Date of Patent: Jun. 2, 1987

[54] INTEGRATED CIRCUIT FABRICATION PROCESS FOR FORMING A BIPOLAR TRANSISTOR HAVING EXTRINSIC BASE REGIONS

[75] Inventors: Matthew Weinberg, Mountain View; Mammen Thomas; Shiao-Hoo Chang, both of San Jose, all of Calif.

[73] Assignee: Advanced Micro Devices, Inc., Sunnyvale, Calif.

[21] Appl. No.: 794,357

[22] Filed: Nov. 1, 1985

[51] Int. Cl.[4] ............... H01L 21/265; H01L 21/203; H01L 27/02
[52] U.S. Cl. ..................... 29/576 B; 29/578; 148/1.5; 148/187; 148/DIG. 10; 357/34
[58] Field of Search ............... 29/576 B, 576 T, 578; 148/1.5, 187; 357/34

[56] References Cited

U.S. PATENT DOCUMENTS

| | | | |
|---|---|---|---|
| 4,111,726 | 9/1978 | Chen | 148/175 |
| 4,433,471 | 2/1984 | Ko et al. | 29/578 |
| 4,443,933 | 4/1984 | de Brebisson | 29/576 B |
| 4,481,706 | 11/1984 | Roche | 148/1.5 |
| 4,484,211 | 11/1984 | Takemoto et al. | 357/50 |
| 4,573,256 | 3/1986 | Lechaton et al. | 29/576 B |
| 4,574,469 | 3/1986 | Mastroianni et al. | 29/576 B |

Primary Examiner—Upendra Roy
Attorney, Agent, or Firm—Patrick T. King; Eugene H. Valet

[57] ABSTRACT

An integrated circuit bipolar transistor fabrication technique is disclosed. The process includes steps to form shallow, self-aligned, heavily doped, extrinsic base regions which do not encroach substantially upon the emitter region. The process allows for construction of transistors which require a thinner epitaxial layer or, in the alternative, i.e., with a typical epitaxial layer, have a higher collector-to-base breakdown voltage.

9 Claims, 11 Drawing Figures

INTEGRATED CIRCUIT FABRICATION PROCESS FOR FORMING A BIPOLAR TRANSISTOR HAVING EXTRINSIC BASE REGIONS

BACKGROUND OF THE INVENTION

1. Field of the Invention

The present invention generally relates to integrated circuit fabrication processes and, in particular, to an integrated circuit process for forming a bipolar transistor having extrinsic base regions.

2. Description of the related Art

In the manufacture of integrated circuits, improvements in the state of the art in process techniques allow the fabrication of devices which have many more components on the same size die. At the same time that either the number of components is increased or the die size is reduced, it is necessary to reduce defects in order to provide a high manufacturing yield of operationally acceptable die on each wafer. As more and more components are constructed on each die, the increased device density should not result in any loss of manufacturing effectiveness. Preferably, performance and reliability would actually be improved in each generation despite the problems inherent in shrinkage.

For example, self-alignment process techniques, i.e., the use of one region or layer of a device as a mask to form another region, can improve the performance, reliability and yield factors.

Reducing the size of each component has other beneficial results. Parasitic capacitive effects can be minimized by lateral reduction of device regions. Vertical scaling, such as in the form of shallower junctions, and reduced base thicknesses enhance switching times, provide higher base-collector breakdown voltages, and prevent two-dimensional beta degradation. Therefore, a prime objective of integrated circuit fabrication technology is to develop process techniques to create layouts which are adaptable to shrinkage in both the lateral and vertical dimensions.

In bipolar circuit technology, improvement of individual transistor performance is achieved, in part, by reducing base region resistance and its associated debiasing effect and by minimizing parasitic capacitive effects of the emitter-base junction. As shown in FIG. 1 (prior art), this is often accomplished by providing a lightly doped intrinsic base region and a heavily doped extrinsic base region for each transistor.

Details of a typical process for the fabrication of bipolar transistors can be found in texts on semiconductor fabrication such as *Microelectronics Processing and Device Design*, R. A. Colclasser, John Wiley & Sons, copyright 1980.

Summarily, a p-type substrate is oxidized on its upper surface and etched to form a mask used for diffusion of a buried collector region. After the diffusion of n-type impurities, the oxide layer is then stripped and an n-type epitaxial silicon layer is grown. Next, a masking layer is deposited and patterned whereby "field oxide" regions are formed. Another mask is then used to allow diffusion of dopants into the epitaxial layer beneath device separation field oxide regions to form p-type regions which will isolate the individual transistors from adjacent components. Slot or oxide isolation also can be used.

Next in a typical fabrication process, a mask layer is deposited and anisotropically etched to expose a surface area of the silicon epitaxial layer. Extrinsic base regions are then formed in the substrate by deep drive-in or implant and deep drive-in processes. The base oxide layers grown over the doped regions enhance diffusion of the extrinsic base regions into the yet to be formed emitter region and deeper into the epitaxial layer, as demonstrated by FIG. 1. At this stage, the mask is removed and the intrinsic base, emitter and collector are formed. These effects result in degradation of the transistor performance. This process requires a thick epitaxial layer because the extrinsic base profile which results is relatively deep and wide.

Shrinkage of a device with such a profile would result in an unacceptably proportioned transistor. One problem is that the extrinsic base profile is too deep and too wide. With current fabrication and photolithography techniques, emitter width after encroachment by the extrinsic base regions, as shown in FIG. 1, is approximately 1.0 to 2.0 microns. Any significant shrinkage would result in an unacceptable emitter width. Such a transistor would be subject to significant reverse injection and two-dimensional beta reduction.

Moreover, it is common for epitaxial layers to have a thickness of approximately 1.5 to 2.5 microns. Current techniques result in an extrinsic base junction depth of approximately 0.5 to 0.7 micron. During epitaxial layer growth, the buried layer diffuses approximately 0.5 to 0.6 micron upward into the epitaxial layer. Collector-to-base breakdown voltages, $BV_{cbo}$, for a thinner epitaxial layer would occur at 10–15 volts or less, which could be unacceptable for many applications.

Hence, a process of forming a bipolar transistor with a shallower and narrower extrinsic base is needed.

SUMMARY OF THE INVENTION

It is an object of the present invention to provide a method of forming a bipolar transistor having a cross-sectional profile amenable to device shrinkage.

A further object of the present invention is to provide a process for the fabrication of bipolar transistors wherein oxidation step enhanced diffusion of extrinsic base regions into emitter regions is virtually eliminated, thereby minimizing extrinsic base-emitter parasitic capacitance, two-dimensional beta effects, and low emitter-base breakdown voltages.

In a general aspect, the present invention is a method used in the manufacture of integrated circuits for forming bipolar transistors. The process forms self-aligned, shallow, heavily doped, extrinsic base regions which do not substantially encroach upon emitter regions A mask layer, such as thermal silicon nitride, is formed on the epitaxial layer structure, which may include a buffer oxide layer. A second mask layer, such as a relatively thick, fast-etching glass, is formed on the first. Both layers are etched away over the areas of the wafer's epitaxial layer where the extrinsic base regions are to be formed. Base oxide regions are formed in the surface of the epitaxial layer over these regions. Doping is performed through the base oxide by ion implantation while the remaining mask regions prevent doping or damage to any other regions. The two masking layers are removed and the remaining active regions of the transistor and integrated circuit are formed in and superposing the epitaxial layer.

The process disclosed provides an advantage in that it is a self-aligned process which can improve quality control, performance due to resultant low base resistance, reliability, and manufacturing yield of devices fabricated in accordance with the present invention.

A further advantage is that the present invention allows the fabrication of emitter regions having a width of one micron or less, thereby reducing parasitic capacitance, yet improving device density capability.

Yet another advantage of the present invention is that the growth of base oxide prior to base region doping reduces device defects which can be formed and propagated by high temperature cycles associated with oxidation growth.

Another advantage is that the present invention results in a bipolar transistor having a shallow extrinsic base, permitting fast or high voltage (or both) bipolar integrated circuit devices to have a thinner epitaxial layer and, therefore, better performance.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIGS. 2a through 2h are cross-sectional schematic drawings of an idealized sequence of process steps of forming a bipolar transistor, according to the present invention, in which:

FIG. 2a shows step completion of a substrate having an oxidized-layer and a doped region;

FIG. 2b shows step completion after stripping the oxidation layer and formation of an epitaxial layer on the substrate, having a buffer oxide and nitride masking layer;

FIG. 2c shows step completion after formation of field oxidation regions;

FIG. 2d shows step completion after formation of isolation regions and further oxidation;

FIG. 2e shows step completion after a stripping and reformation of a thick nitride layer, an overlaying glass layer and a mask;

FIG. 2f shows step completion after etching has been performed to leave the nitride and glass layers over the structure except where the extrinsic base regions are to be formed;

FIG. 2g shows the structure wherein base oxide regions have been formed and an impurity implant is performed; and FIG. 2h shows step completion in which emitter and collector sinker regions have been formed.

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor(s) for practicing the invention. Alternative embodiments are also briefly described as applicable.

It should be recognized that many publications describe the details of common techniques used in the fabrication process of integrated circuit components. See, e.g., *Semiconductor & Integrated Circuit Fabrication Techniques*, Reston Publishing Co., Inc., copyright 1979 by the Fairchild Corporation. Those techniques generally can be employed in the fabrication of the structure of the present invention. Moreover, the individual steps of such a process can be performed using commercially available integrated circuit fabrication machines. As specifically necessary to an understanding of the present invention, approximate technical data is set forth based upon current technology. Future developments in this art may call for appropriate adjustments as would be obvious to one skilled in the art.

As an example of a best mode of practice, the process steps will be disclosed herein for forming an n-p-n type bipolar transistor. It should be understood from the outset that the process is not limited to such an embodiment, but shall be recognized by anyone skilled in the art as amenable to adaptations for the construction of similar devices, e.g., p-n-p type.

Figure 2A:
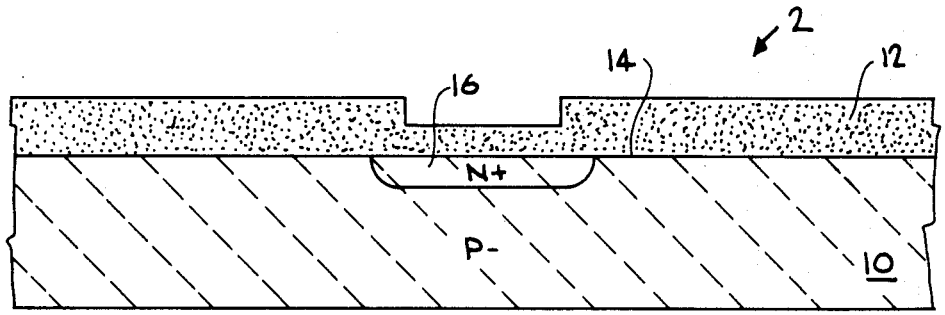

FIG. 2a shows a semiconductor wafer substrate 10 of a p or "acceptor" type conductivity, having a substantially planar upper surface 14. Generally, such wafers are formed of crystalline silicon and are commercially available.

A silicon dioxide ("oxide") layer 12 is formed on the substrate surface 14. The thickness of this oxide is approximately 15,000 Angstroms. The layer 12 is used as a mask for forming the transistor collector region in the substrate surface 14.

A collector region 16 is formed by doping the substrate with ions which will cause the region to have a second-type conductivity, n, or "donor", type which is effectively opposite that of the substrate 10. Common photoresist masking and diffusion or ion implant techniques can be used with a dopant such as antimony, Sb, to form the collector region 16. The collector region 16 is formed to have a relatively heavy dopant concentration, "n+," of approximately $1 \times 10^{19}$ to $10^{20}$ per $cm^3$. The junction 18 depth is approximately 2 microns below the substrate surface 14. The width is approximately 3.5 to 5.0 microns. The length will be dependent upon the device of which the transistor is a component. The mask layer 12 is then stripped from the substrate surface 14.

Figure 2B:
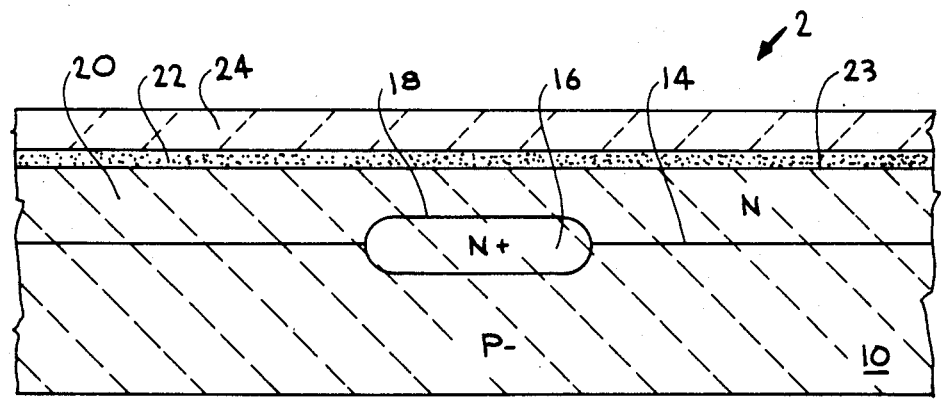

Referring to FIG. 2b, epitaxial layer 20 is formed on the surface 14 of the substrate. During this growth, the collector region 16 will diffuse upward into the epitaxial layer 20 approximately 0.5 to 0.7 micron.

The epitaxial layer 20 can be kept down to a thickness of approximately $1.1 \pm 0.1$ micron. In general, the collector-to-base breakdown voltage, $BV_{cbo}$, of the final transistor is directly proportional to the thickness of epitaxial silicon between the two regions. Therefore, to fabricate a device with a higher $BV_{cbo}$, the thickness of the epitaxial layer 20 can be increased. For better performance in a bipolar integrated circuit device, a thinner epitaxial layer 20 is preferable to increase speed.

A buffer layer 22 is formed on the surface 23 of the epitaxial layer 20. This layer is conventionally deposited or grown, for example, to a thickness of approximately 300–400 Angstroms.

A masking layer 24 of silicon nitride ("nitride") is then formed upon the buffer layer 22. The nitride layer 24 has a thickness of approximately 500 to 1500 Angstroms. The nitride mask is then patterned, such as by conventional photolithography techniques, to expose those areas of the epitaxial layer surface 23 where it is to be oxidized in order to form field oxide regions 25, 26, 27 which will be used to define and isolate specific device surface areas.

Figure 2C:
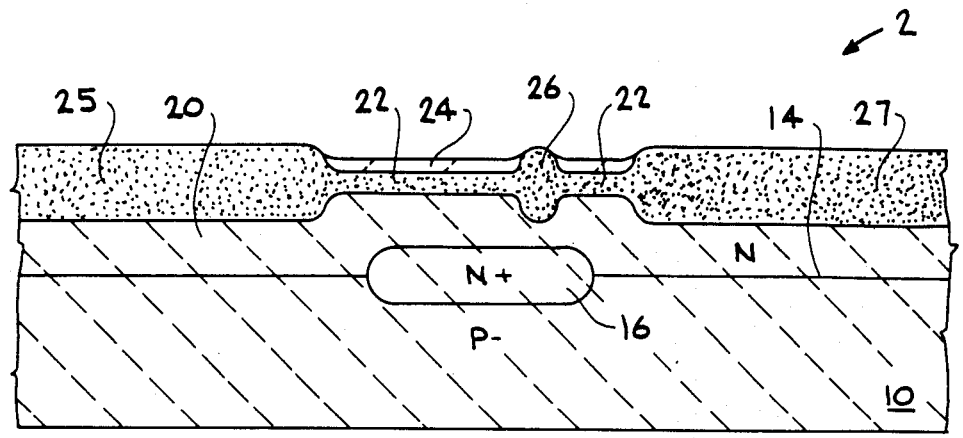

As depicted in FIG. 2c, field oxide regions 25, 26, 27 are grown to a thickness of approximately 8,000–10,000 Angstroms.

Figure 2D:
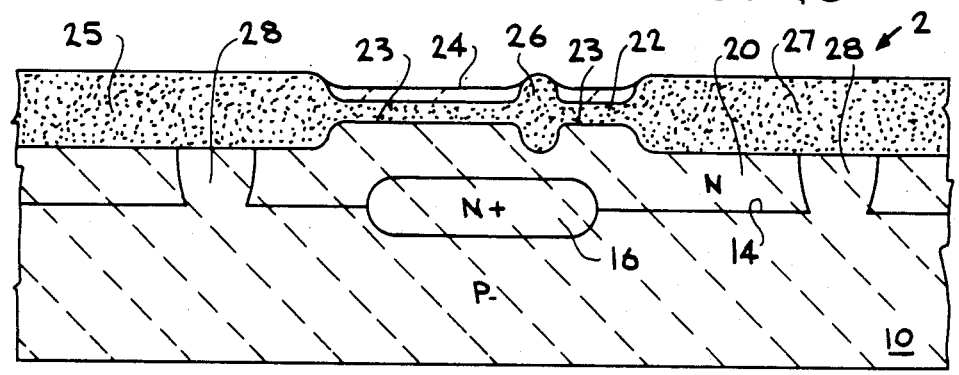

The individual components constructed in the epitaxial layer 20 also can be isolated down to the substrate surface 14. Again, conventional isolation masking and etching techniques are used to form oxide, or slot or, as shown in FIG. 2d, doped regions 28 to match the conductivity type of the substrate. As an example, boron ions can be diffused or implanted into the epitaxial layer 20 to a concentration of approximately $10^{19}$ ions per $cm^3$.

Remaining nitride layers 24 and oxide buffer layers 22 are then stripped from the structure 2. An optional, relatively thin oxide buffer layer (not shown) can be regrown on the exposed epitaxial surface areas 23 to a thickness of approximately 300–400 Angstroms.

Figure 2E:
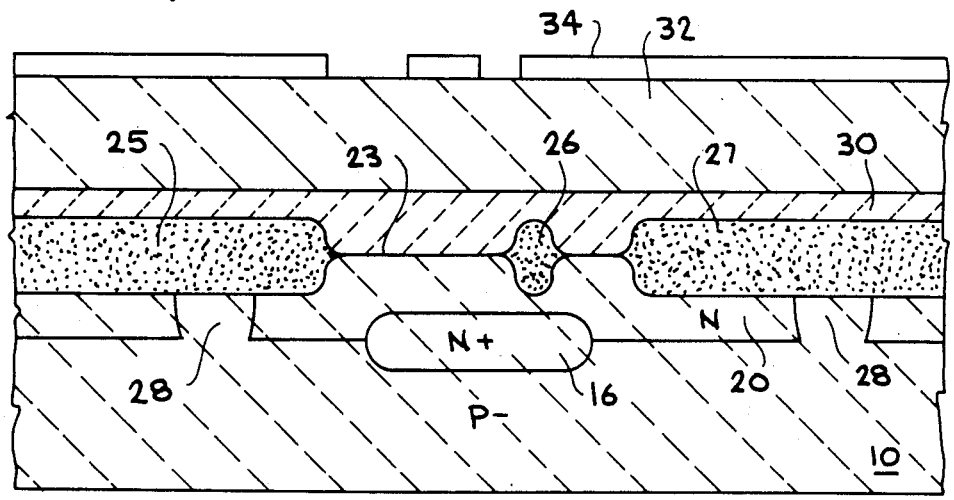

Referring now to FIG. 2e, a thermal nitride layer 30 is formed on the structure 2. The thickness of the thermal nitride layer 30 is approximately 500–1500 Angstroms. Next, a relatively thick layer 32 of a fast-etching glass is formed upon the thermal nitride layer 30. A material such as CVD silicon dioxide ("silox" or "PVX") of a 4 percent to 10 percent doping, such as with phosphorous or boron ions or both, is deposited to a thickness in the range of approximately 6000–10,000 Angstroms.

Figure 2F:
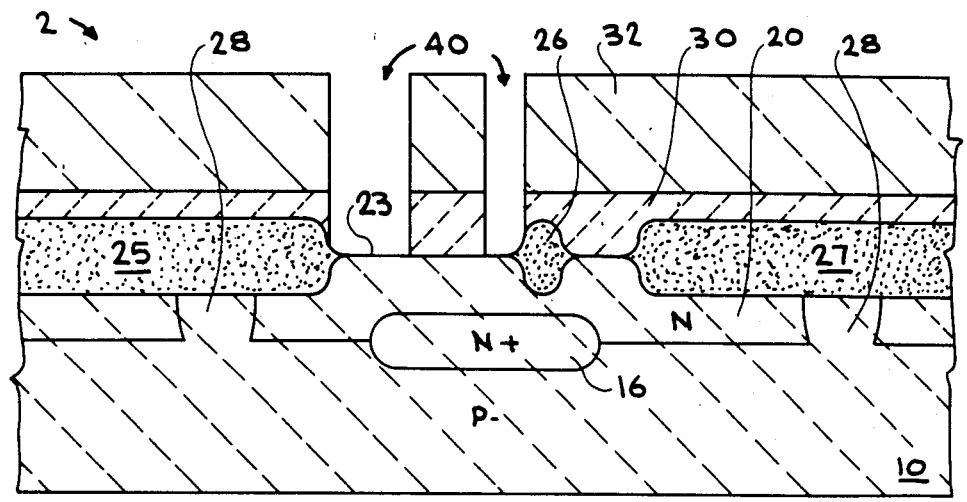

Next, the structure 2 is masked in accordance with the pattern which will define the active device areas in the surface 23 of the epitaxial layer 20 between the field oxide regions 25, 26, 27. The mask 34 is then used to etch away both the glass layer 32 and the thermal nitride layer 30 to form windows 40, as shown in completion in FIG. 2f.

It is also important to note that the use of the composite mask 34 for this step will result in the self-alignment of the extrinsic base regions while the thermal nitride 30 and glass 32 layers protect the emitter, intrinsic base, and collector contact areas yet to be formed and other regions of the die.

Figure 2G:
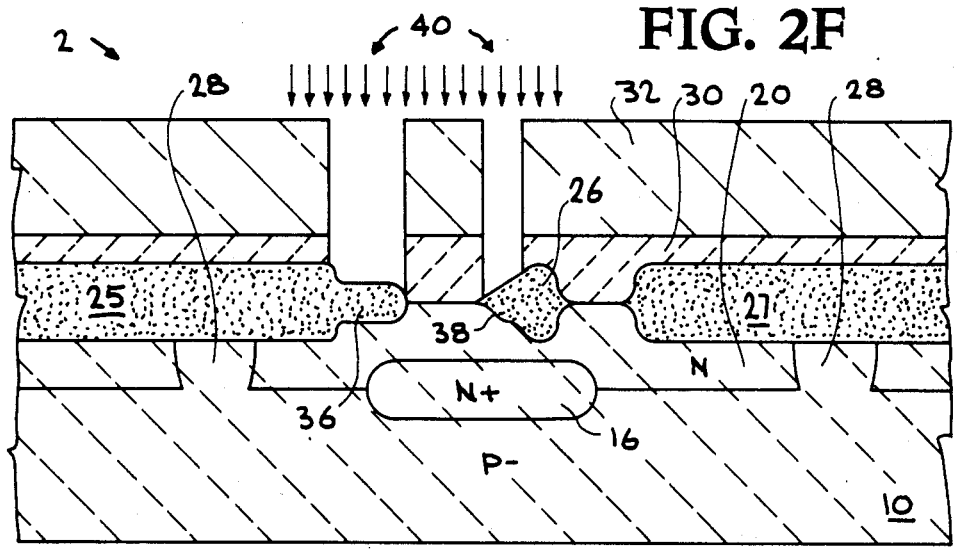

Referring to FIG. 2g, base oxide regions 36, 38 are grown to a thickness of approximately 1500–4000 Angstroms The structure 2 is now ready for the implant of ions to form the extrinsic base regions of the transistor.

In order to obtain a low sheet resistance for the base region, for example approximately 50–500 ohms per square, a high-dose, high-energy implant is needed. The thick, stratified layers of thermal nitride 30 and glass 32 will prevent such an implant process from penetrating to other active device areas and causing either doped regions to be formed or causing damage to other components in the die, such as transistors and Schottky diode junctions which may have been formed in other stages of the overall fabrication process.

Acceptor-type ions, such as boron (represented by unnumbered arrows in FIG. 2g), are then implanted into the epitaxial layer 20 through the base oxide regions 36, 38. Depending upon the desired resistance, therefore, the implant dosage is varied. To obtain, for example, a sheet resistance of 365 ohms per square, an implant dosage of approximately between $1 \times 10^{14}$ to $2 \times 10^{14}$ per $cm^2$ at 130 keV results in extrinsic base regions 42 having a concentration of approximately $10^{18}$ to $10^{19}$ boron ions per $cm^3$. The junction depths of the extrinsic base regions 42 from this implant are about 0.35 micron. Implant energy variation and subsequent heat treatment conditions will determine the exact depth.

The high-energy implant may result in damage to the base oxide regions 36, 38. Heat treatment in a nitrogen ambient at about 750°–950° C. for approximately 30 minutes should be sufficient to repair the damage sites. The lower the temperature, the less will be the diffusion of the extrinsic base dopants. This heat treatment cycle is needed to prevent excessive etching to the base oxide regions 36, 38 when the glass layer 32 is stripped.

For example, the selectivity of a doped silox glass layer 32 to the base oxide regions 36, 38 in 10:1 hydrofluoric fluoric acid is about 10:1 for a 4 percent doping of the glass layer 32. The ratio will increase with increased doping. After an 8000 Angstrom-thick silox layer 32 is stripped, the base oxide region 36, 38 thickness is reduced by about 400–800 Angstroms.

Next, the remaining portions of the thermal nitride layer 30 are removed. This is followed by conventional integrated circuit fabrication process steps to form the intrinsic base region 44, the emitter region 46, and the collector sinker region 48 and respective contacts.

Figure 2H:
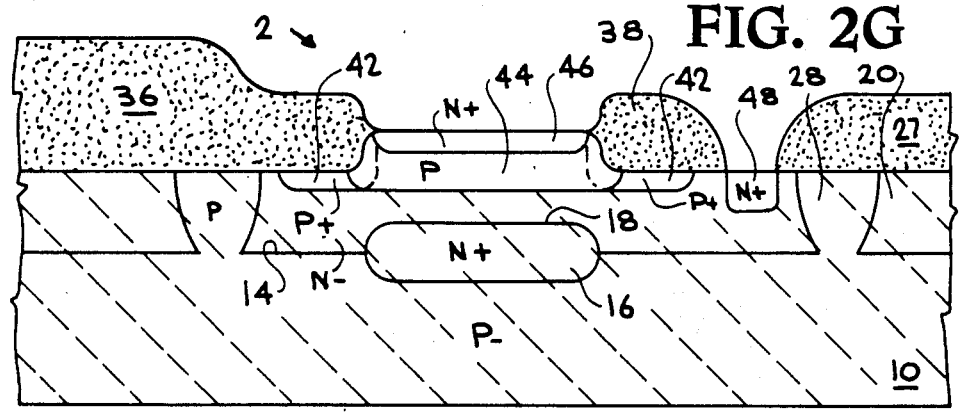

The profile of the completed transistor structure 2 is shown in FIG. 2h. Conventional processing can continue to form passivation and metallization interconnect layers. As shown in this FIGURE by dotted lines, the extrinsic base regions 42 do not substantially encroach upon the emitter region 46 in this profile.

Figure 1:
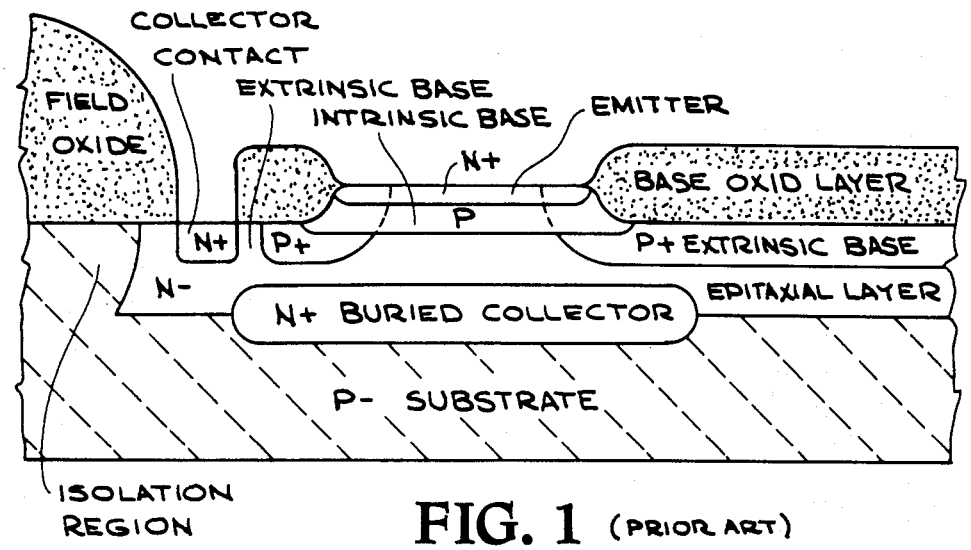
FIG. 1 is a cross-sectional schematic drawing of a bipolar transistor having intrinsic and extrinsic base regions formed using typical fabrication process steps.
Figure 3:
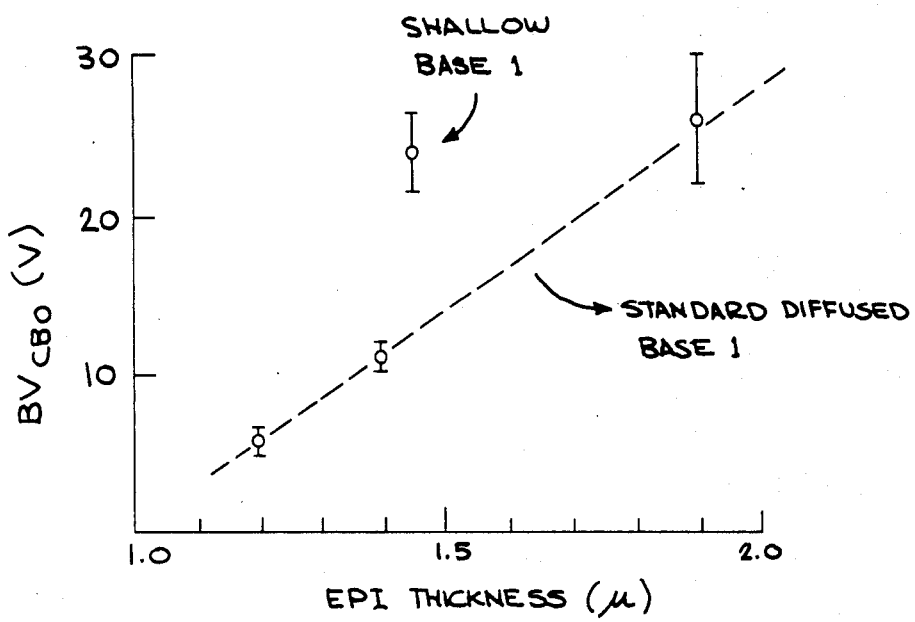
FIG. 3 is a graphical comparison of breakdown voltage performance vs. epitaxial layer thickness for the prior art and a device fabricated in accordance with the present invention.

In addition to providing a self-aligning technique, the present invention has substantially improved performance characteristics. As shown in FIG. 3, the collector-to-base breakdown voltage of a transistor formed in accordance with the present invention has a range of approximately 20–28 volts with an epitaxial layer thickness of only about 1.4 to 1.5 microns. In a standard transistor, i.e., one with a profile similar to that shown in FIG. 1, an epitaxial layer thickness of about 1.9 microns must be provided. Conversely, because of the relatively linear relationship between the epitaxial layer thickness and the breakdown voltage, a transistor constructed in a 1.9 micron epitaxial layer would have a very high collector-to-base breakdown voltage.

Figure 4:
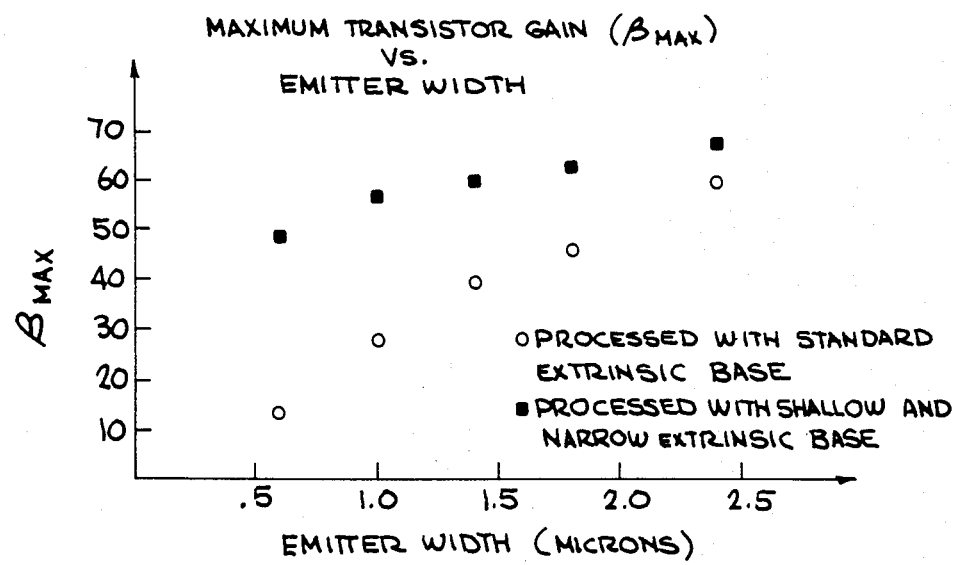
FIG. 4 is a graphical comparison of transistor gain versus emitter width for the prior art and a device fabricated in accordance with the present invention.

In FIG. 4, the superior device characteristics associated with the present invention are illustrated. While devices constructed with the conventional extrinsic base process suffer reduction in transistor gain with decreasing emitter width, devices formed in accordance with the present invention are not subject to significant gain (beta) reduction. Due to the substantial extrinsic base encroachment into the emitter region, conventional transistors are degraded, while the shallow and narrow extrinsic base profile of the present invention prevents such degradation. It is apparent from FIG. 4, that the present invention allows significant scaling of device features to occur without sacrificing performance. Thus, greater packing densities, higher yields, and better overall speeds can be attained.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Any process steps described might be interchangable with other steps in order to achieve the same result. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In the manufacture of integrated circuits, an improved process for fabricating at least one bipolar transistor having an extrinsic base region in a semiconductor material, having a substrate of a first conductivity type, including the steps of introducing impurities of a second conductivity type into a first region of said substrate, said first region forming a buried collector region of said transistor; forming an epitaxial layer of said semiconductor material, superposing said substrate, of said second conductivity type, such that the concentration is less than theconcentration in said first region; and forming a mask layer superposing said epitaxial layer; characterized by the steps of:
   (1) selectively removing portions of said mask to expose only those epitaxial layer areas where extrinsic base regions are to be formed;
   (2) forming insulator regions extending into said epitaxial layer at said exposed areas such that said insulator regions at least partially superpose, but do not extend into, said first region;
   (3) implanting dopants of said first conductivity type into said areas through said insulator regions to form said extrinsic base regions;
   (4) removing said mask;
   (5) forming an intrinsic base region, having said first conductivity type which is less than said extrinsic base regions, between said insulator regions; and
   (6) forming an emitter region, having said second conductivity type and a doping concentration which is higher than said epitaxial layer, superposing said intrinsic base region between said insulator regions, such that said extrinsic base regions do not encroach substantially into said intrinsic base and emitter regions.

2. The process as set forth in claim 1, following said step of forming extrinsic base regions, further comprising the step of:
   heat treating said insulator regions to repair any damage sites formed during said step of forming extrinsic base regions.

3. The process as set forth in claim 1, wherein said steps of forming a mask further comprises:
   employing materials which will prevent said introduction of impurities into regions of said epitaxial layer covered by said layer.

4. The process as set forth in claim 1, wherein said step of forming extrinsic base regions further comprises:
   implanting dopants into said extrinsic base regions with an energy which results in said regions having a predetermined depth which will not exceed the depth of said intrinsic base.

5. The process as set forth in claim 3, wherein said step of forming a mask comprises:
   forming a first layer of masking material of thermal silicon nitride superposing said epitaxial layer.

6. The process as set forth in claim 5, further comprising:
   forming a relatively thin layer of silicon dioxide adjacent said epitaxial layer prior to forming said layer of thermal silicon nitride,
   whereby said silicon dioxide forms an interstitial buffer layer between said epitaxial layer and said silicon nitride layer.

7. The process as set forth in claim 5, wherein said step of forming said layer of masking material further comprises:
   depositing a layer of glass material on said first layer of thermal silicon nitride.

8. The process as set forth in claim 7, wherein said step of forming a layer of glass material further comprises:
   employing a glass material for said second layer which etches at a faster rate than a material employed for said insulator regions under the influence of an etchant.

9. An improved method for constructing at least one bipolar transistor in an integrated circuit fabrication process, performed on a semiconductor wafer of a material having a conductivity of a first type, including the formation of self-aligned, shallow junction, heavily doped, extrinsic base regions, comprising the steps of:
   doping a surface region of said wafer with dopants such that said region will have a conductivity of a second type, wherein said region is a collector region of said transistor;
   growing an epitaxial layer of said semiconductor material having said second conductivity type superjacent said wafer such that said collector region is buried at the interface of said wafer and said epitaxial layer, characterized by;
   forming at least three adjacently spaced field oxidation surface regions extending into said epitaxial layer such that the middle oxidation region at least partially superposes, but does not extend into, said buried collector region;
   forming a first mask on said epitaxial layer with said oxidation regions;
   forming a second mask superjacent said first mask, said second mask being formed of a material having a faster etch-rate property than said oxide;
   etching said second and first masks such that a first surface region of said epitaxial layer adjacent said middle oxidation region and a second surface region adjacently spaced from said first surface region are exposed;
   forming base oxide regions in each of said exposed first and second surface regions;
   doping said epitaxial layer only beneath said base oxide regions to form extrinsic base regions of said transistor having said first conductivity type of a higher degree than said wafer;
   removing said second and first masks;
   forming an intrinsic base region of said transistor in said surface of said epitaxial layer between said base oxide regions;
   forming an emitter region of said transistor in said epitaxial layer superposing said intrinsic base region; and
   forming contacts to said emitter, collector and intrinsic base,
   whereby said extrinsic base regions do not substantially encroach upon said emitter region.

* * * * *